(12) United States Patent
Skidmore et al.

(10) Patent No.: US 7,224,035 B1
(45) Date of Patent: May 29, 2007

(54) APPARATUS AND FABRICATION METHODS FOR INCORPORATING SUB-MILLIMETER, HIGH-RESISTIVITY MECHANICAL COMPONENTS WITH LOW-RESISTIVITY CONDUCTORS WHILE MAINTAINING ELECTRICAL ISOLATION THEREBETWEEN

(75) Inventors: George D. Skidmore, Plano, TX (US); Gregory A. Magel, Dallas, TX (US); Charles G. Roberts, McKinney, TX (US)

(73) Assignee: Zyvex Corporation, Richardson, TX (US)

( * ) Notice: Subject to any disclaimer, the term of this patent is extended or adjusted under 35 U.S.C. 154(b) by 376 days.

(21) Appl. No.: 10/266,724

(22) Filed: Oct. 7, 2002

(51) Int. Cl.
*H01L 27/12* (2006.01)

(52) U.S. Cl. .............................. 257/414; 257/E21.545; 438/48

(58) Field of Classification Search ................ 257/414, 257/415, 416, 417, 418, 419, 420; 438/48, 438/49, 50, 51, 52, 53
See application file for complete search history.

(56) References Cited

U.S. PATENT DOCUMENTS

| | | | |
|---|---|---|---|
| 5,650,568 A | * | 7/1997 | Greiff et al. |
| 5,811,315 A | | 9/1998 | Yindeepol et al. |
| 5,846,849 A | | 12/1998 | Shaw et al. |
| 6,051,866 A | | 4/2000 | Shaw et al. |
| 6,055,460 A | * | 4/2000 | Shopbell |

(Continued)

OTHER PUBLICATIONS

Zhang, Dacheng, et al.; *A novel isolation technology in bulk micromachining using deep reactive ion etching and a polysilicon refill*; Journal of J. Mecromech. Microeng. vol. 11, 2001, pp. 13-19.

(Continued)

*Primary Examiner*—Leonardo Andujar
*Assistant Examiner*—Kevin Quinto
(74) *Attorney, Agent, or Firm*—Haynes and Boone, LLP (57) ABSTRACT

Fabricating electrical isolation properties into a MEMS device is described. One embodiment comprises a main substrate layer of a high-resistivity semiconductor material, such as high-resistivity silicon. The high-resistivity substrate is then controllably doped to provide a region of high-conductivity in the main substrate. Electrical isolation is achieved in such an embodiment by patterning the high-conductivity region either by masking the main substrate during the doping or etching through the doped, high-conductivity region in order to form regions of high conductivity. Effective isolation results from confinement of electrical currents to the lowest-resistance path. An alternative embodiment employs the fabrication of pn junctions and the use of reverse biasing to enhance the electrical isolation. A further embodiment comprises a main substrate layer of low-resistivity semiconductor material with a layer of insulator deposited thereon. High-conductivity or low-resistivity material is then grown on top of the insulator to create electrically isolated conductors.

69 Claims, 10 Drawing Sheets

U.S. PATENT DOCUMENTS

| | | | |
|---|---|---|---|
| 6,121,552 | A | 9/2000 | Brosnihan et al. |
| 6,187,684 | B1 * | 2/2001 | Farber et al. |
| 6,239,473 | B1 | 5/2001 | Adams et al. |
| 6,277,666 | B1 * | 8/2001 | Hays et al. |
| 6,291,875 | B1 | 9/2001 | Clark et al. |
| 6,306,729 | B1 * | 10/2001 | Sakaguchi et al. |
| 6,428,713 | B1 | 8/2002 | Christenson et al. |
| 6,573,154 | B1 | 6/2003 | Sridhar et al. |
| 6,673,694 | B2 * | 1/2004 | Borenstein |
| 2002/0011759 | A1 * | 1/2002 | Adams et al. ............ 310/309 |

OTHER PUBLICATIONS

Muller, Lilac, et al.; *Electrical isolation process for molded, high-aspect-ration polysilicon microstructures*; Dept. of Mechanical Engineering, University of California at Berkeley, 6 pages.

Ayazi, Farrokh, et al.; *High aspect-ratio combined poly and single-crystal silicon (HARPSS) MEMS technology*; Journal of J. Microelectromechanical Systems, vol. 9, No. 3, Sep. 2000, pp. 288-294.

Forsberg, M., et al.; *Shallow and deep trench isolation for use in RF-biopolar IC:s*; Applied Materials, 4 pages.

* cited by examiner

APPARATUS AND FABRICATION METHODS FOR INCORPORATING SUB-MILLIMETER, HIGH-RESISTIVITY MECHANICAL COMPONENTS WITH LOW-RESISTIVITY CONDUCTORS WHILE MAINTAINING ELECTRICAL ISOLATION THEREBETWEEN

GOVERNMENT INTERESTS

The invention was made with Governmental support under Contract 70NANB1H3021 awarded by the National Institute of Standards and Technology (NIST), Grants and Agreements Management Division, 100 Bureau Drive, MAIL STOP 3580, Building 411, Room A143, Gaithersburg, Md. 20899-3580. The Government has certain rights in the invention.

CROSS-REFERENCE TO RELATED APPLICATIONS

This application relates to U.S. Pat. application Ser. No. 10/266,726, now issued U.S. patent No.10/266,726 entitled "Microcomponent Having Intra-Layer Electric Isolation With Mechanical Robustness," the disclosure of which are hereby incorporated herein by reference.

TECHNICAL FIELD

The present application relates in general to sub-millimeter electromechanical devices, and more particularly, to a device and method for fabricating mechanically sound Microelectromechanical systems (MEMS) components having electrical isolation properties.

BACKGROUND OF THE INVENTION

MEMS combine micro-scaled mechanical and electrical components into integrated systems. MEMS are typically used as microsensors, microactuators, and the like, and have found beneficial use for implementing accelerometers and other such inertial instruments. MEMS may also be used in chemical detectors, pressure sensors, thermal and/or electrostatic actuators, and the like. The use and applicability of such devices is only increasing as the intelligence and complexity of the MEMS increases, at the same time that the overall scale of the devices is decreasing into the nano-scaled, nanoelectromechanical systems (NEMS).

Many sub-millimeter MEMS/NEMS utilize capacitive connections or operations to implement the sensing or actuating functions. Moreover, many MEMS/NEMS use thermal energy for operation, which may require running electrical current across such MEMS/NEMS elements. The complexity of electronic circuitry for all types of these devices continues to increase. Therefore, in order to maintain the functionality of the capacitive elements, thermal elements, and the overall growing electronics, it is desirable to create MEMS/NEMS devices with electrical isolation properties. With the bulk of current technology settled mostly into the sub-millimeter MEMS region, techniques have been developed for fabricating micro-scaled devices with electrical isolation elements.

One such method, disclosed in U.S. Pat. No. 6,291,875, issued to Clark et al., entails etching a trench to physically separate the conductive material on the device and then filling that trench with an insulating material in order to re-attach the two portions. Thus, the electrical isolation is generally created by cutting the conductive connection and then mending the cut with an electrically isolating substance. With the insulating layer added, the device is again mechanically connected allowing the micromechanical aspect of the MEMS device to continue.

One problem associated with the trench-fill method for electrically isolating MEMS devices, are the cavities or voids that are typically formed in the insulating material filling the trench. The material used for the insulating layer typically does not uniformly fill the trenches. The unevenness may generally cause the upper portion of the trench to close before the lower portion of the trench is completely filled. This creates gaps or voids within the trench that can sometimes weaken the structural integrity of the device and can lessen the thermal conductivity, which is essential for reliable operation of some devices, such as thermal actuators.

The Clark, et al, patent discusses this problem and is directed to a method for improving the trench-fill by adding condyles to the trenches. Condyles are generally openings or "knuckles" at the trench ends that are wider than the basic trench width to allow the insulating material to more easily fill the trench more before closing off. Thus, the Clark patent requires etching trench patterns to attempt to alleviate the problems caused by the voids or cavities typically formed in regularly shaped trench-fills.

The addition of the condyles in the Clark patent does not guarantee that voids or cavities will not form. The increased opening areas likely improves the fill of the insulating material, but because of the non-uniformity and lack of precise control over the fill process, voids or cavities could still form for the same reasons.

Another method for implementing electrical isolation in sub-millimeter components is described in U.S. Pat. No. 6,239,473, issued to Adams, et al. Adams also describes an trench-fill method in its fabrication of MEMS beams with electrical isolation. Instead of attempting to overcome the problems caused by voids or cavities in the trench-fill, Adams specifically uses voids to form a fill layer that includes a re-entrant profile that increases the accuracy of the vertical etching necessary to form the Adams beams. Adams etches a teardrop shaped trench, with a smaller top portion and a larger bottom portion. This shape actually increases the tendency to form the void or cavity, and allows for the re-entrant profile of the trench-fill. When the step to etch the beam is executed, the re-entrant profile does not shield any of the silicon directly behind the protrusion of the trench-fill from being etched to form the beam. Therefore, Adams sacrifices some structural integrity and thermal conductivity caused by the voids in the trench-fill, to benefit from the re-entrant profile it can use to form its inventive beams. The Adams method, thus, suffers from the structural integrity and thermal conduction problems associated with trench-fill voids/cavities, in order to achieve electrical isolation for its specialized, highly-vertical beam structures.

BRIEF SUMMARY OF THE INVENTION

Embodiments of the present invention are directed to a device and method for fabricating electrical isolation properties into a MEMS device. One embodiment of the present invention comprises a main substrate layer of a high-resistivity semiconductor material, such as high resistivity silicon. The high-resistivity substrate is then either controllably doped to provide a layer of high-conductivity or low-resistivity within the main substrate, or a low-resistivity layer is deposited onto the high-resistivity substrate. Electrical isolation is achieved in such an embodiment of the present invention by patterning the high-conductivity layer either by masking the main substrate layer during the doping process, deposition, or by etching through the doped, high-conductivity layer in order to form regions of high conductivity on the high-resistivity substrate. Alternatively, instead of changing the level of doping between the substrate and the high-conductivity layer, the type of doping can be changed to form isolating pn junctions to confine current within selected regions of the device. The resulting MEMS device fabricated according to the teachings of this embodiment of the present invention establishes electrical isolation while maintaining mechanical rigidity.

Additional embodiments of the present invention are directed to a method for fabricating isolated electrical conductors on a microelectromechanical (MEM) device comprising the steps of forming a patterned conducting region on a substrate. Such isolated electrical conductors may preferably be formed by depositing an insulating layer on the substrate and then depositing a conducting layer on top of the insulating layer. The conductors may be created from the conducting layer by etching a pattern through the conducting layer, or may also be created by depositing a mask layer prior to depositing the conducting layer through the mask layer The micromechanical element may be etched into said substrate.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 1A:
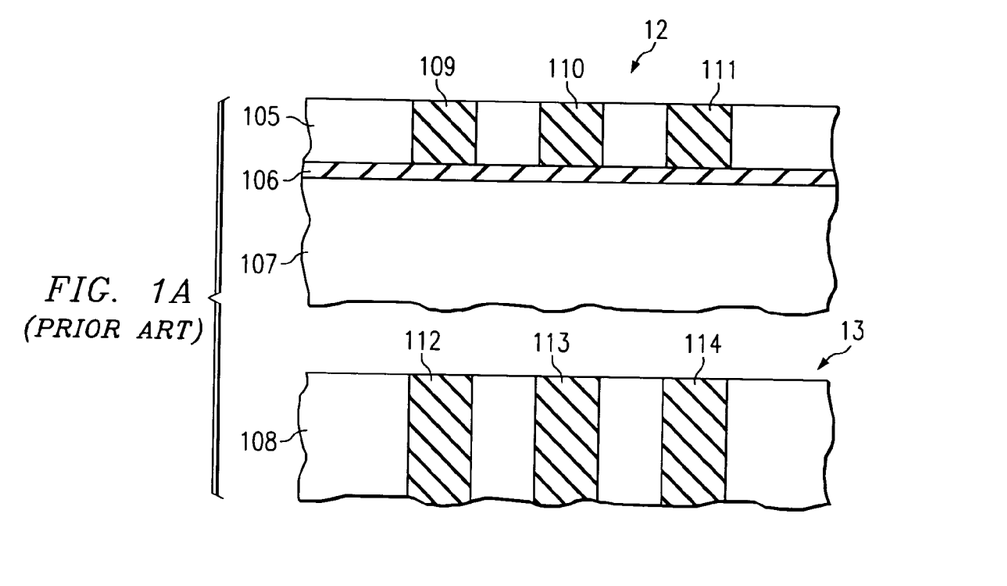
FIG. 1A is a cross-sectional diagram illustrating two typical wafers used in prior art semiconductor processing.

FIG. 1A is a cross-sectional diagram illustrating two typical wafers used in existing semiconductor processing. Silicon on insulator (SOI) wafer 12 includes three layers comprising single crystal silicon (SCS) layer 105, buried oxide (BOx) layer 106, and silicon substrate layer 107. Silicon wafer 13 includes a single layer of silicon, silicon layer 108. In typical applications, such as those described in Clark and Adams, SCS layer 105 and silicon layer 108 are usually low-resistivity silicon allowing for more current flow.

Figure 1B:
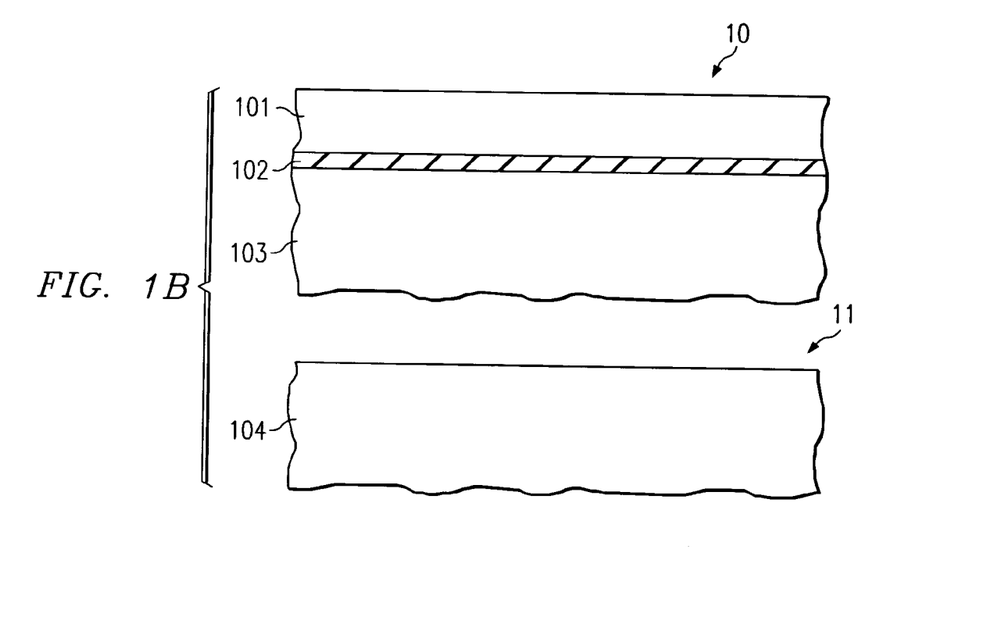
FIG. 1B is a cross-sectional diagram illustrating two wafers that may be used in processes described by one embodiment of the present invention.

FIG. 1B is a cross-sectional diagram illustrating two wafers that may be used in the present invention. SOI wafer 10 includes SCS layer 101, BOx layer 102, and silicon substrate layer 103. Similarly, silicon wafer 11 includes silicon layer 104. However, instead of the low-resistivity silicon used in the prior art wafers, SCS layer 101 and silicon layer 104 each preferably comprise high-resistivity silicon. High-resistivity silicon is generally available in resistivities from 1 k–10 k Ohm-centimeters. The actual resulting resistance is a function of the cross-sectional area of a given device.

Figure 2:
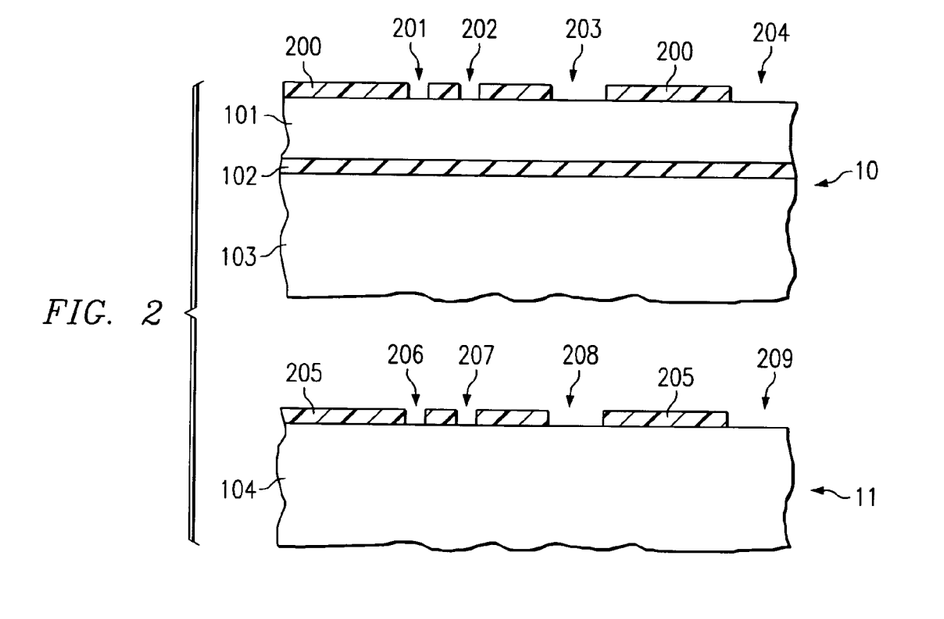
FIG. 2 is a cross-sectional diagram illustrating an SOI wafer and a silicon wafer with patterned photoresist layers masking the wafers.
Figure 3:
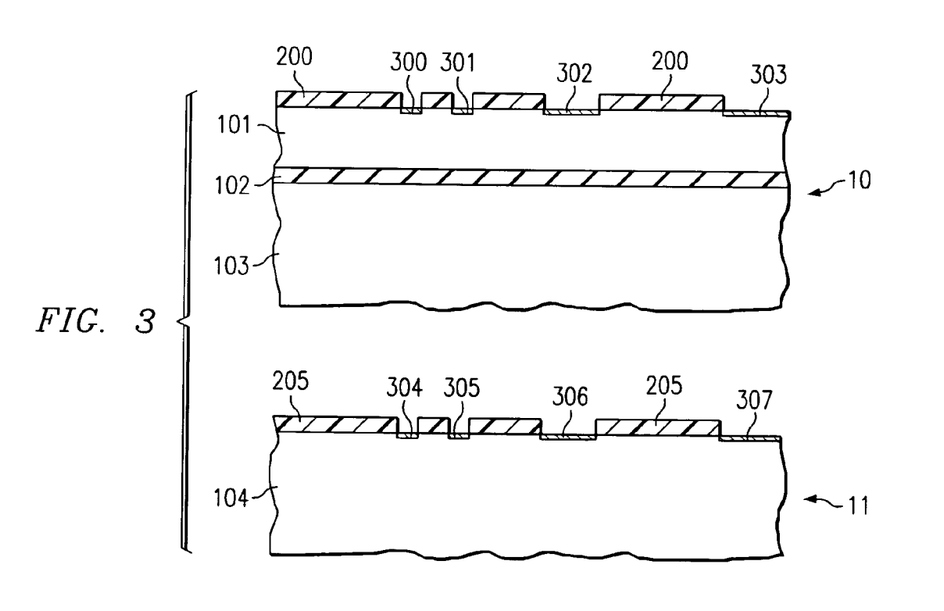
FIG. 3 is a cross-sectional view illustrating the patterned doped top layers of the SOI wafer and the silicon wafer with the photoresist layer still intact.

To begin the fabrication process, the wafer is preferably masked. FIG. 2 is a cross-sectional diagram illustrating SOI wafer 10 and silicon wafer 11 which have been supplemented with photoresist layers 200 and 205. Photoresist layers 200 and 205 have preferably been patterned with openings 201–204 on SOI wafer 10 and openings 206–209 on silicon wafer 11. After masking the wafers, they are then preferably doped with a dopant that results in low-resistivity, such as boron for p-type conductors and phosphorus for n-type conductors. It should be noted that many dopants are available to create conductive layers. The invention is not intended to be limited to only boron and phosphorus. FIG. 3 is a cross-sectional view illustrating the doped top layers of SOI wafer 10 and silicon wafer 11. Because of the masking, the doped layers preferably result in patterns of low-resistivity traces illustrated as conductors 300–303 on SOI wafer 10 and conductors 304–307 on silicon wafer 11.

It should be noted that any of the known doping processes may be used to create the low-resistivity layers in the present invention. If an implantation technique is used, photoresist is acceptable to create the masking. However, if higher temperature techniques, such as the diffusion processes, are used, sturdier masking materials, such as glass, silicon oxide, or the like, should be used for the masking, in order to survive the higher temperatures.

Figure 4:
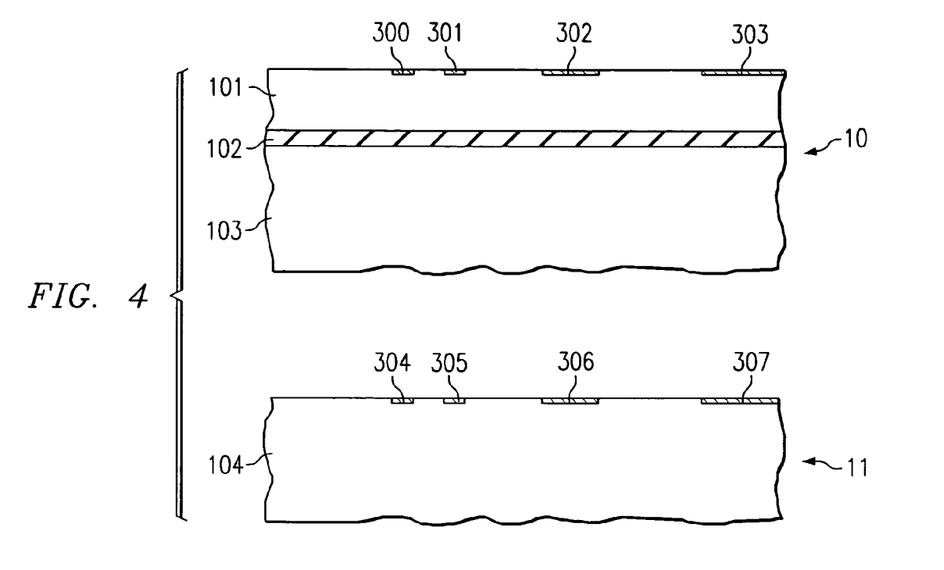
FIG. 4 is a cross-sectional view illustrating the patterned doped top layers of the SOI wafer and the silicon wafer after the photoresist layer has been stripped.

After stripping photoresist layers 200 and 205, SOI wafer 10 and silicon wafer 11, illustrated on FIG. 4, now are preferably left with conducting traces conductors 300–307 separated by high-resistivity silicon. Using current doping technologies, it is generally possible to achieve resistivity as low as 0.001 Ohm-centimeters. In order to achieve an acceptable level of electrical isolation, it is preferably desired to control the cross-sectional area of the doped region in order to result in a factor of at least $10^3$ between the resistivities of the high-resistivity silicon and the doped, low-resistivity conductors. It may be possible and even practical to achieve some level of electrical isolation with less than a factor of $10^3$ difference between the resistivities. However, the closer in resistivity the two silicon layers are, the less electrical isolation will exist. It is desired to achieve the highest practical resistivity isolation between the high- and low-resistivity conductors. In practice, acceptable levels of conductivity may be achieved with low-resistivities as high as 0.01 Ohm-centimeters for corresponding high-resistivity silicon levels of 10 k Ohm-centimeters.

Figure 5:
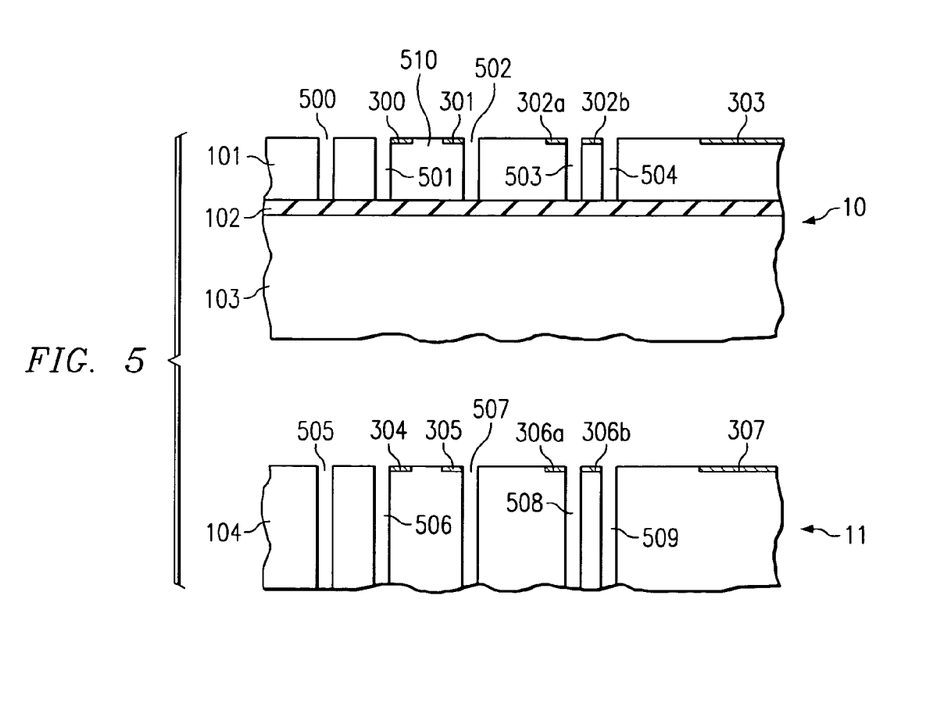
FIG. 5 is a cross-sectional diagram of the SOI wafer and the silicon wafer that include the deep etches used to fabricate micromechanical elements out of the wafers.

The present invention not only involves providing the electrical isolation in semiconductor wafers, but does so preferably with the fabrication of micromechanical elements in the same wafer. FIG. 5 is a cross-sectional diagram of SOI wafer 10 and silicon wafer 11 that include the deep etches used to fabricate the micromechanical elements. Trenches 500–504 on SOI wafer 10 preferably create the different elements that create the micromechanical device. Similarly, trenches 505–509 on silicon wafer 11 preferably create the micromechanical elements thereon.

On creating the micromechanical elements, existing conductors may be separated onto the different micromechanical elements. For example, trench 503 created two conductors, 302A and 302B, from the original conductor 302; thus providing a conducting trace on each of the new micromechanical elements (similarly, trench 508 on silicon wafer 11 created separate conductors 306A and 306B). Each micromechanical element may include multiple conducting traces, such as micromechanical element 510 with conductors 300 and 301. In operation, electricity will preferably flow separately through each of conductors 300 and 301, separated by the high-resistivity silicon of micromechanical element 510.

Instead of resulting in a sub-millimeter MEMS device having substances with different physical properties, as would happen with the trench-fill of dielectric in the prior art methods, the present invention preferably results in a MEMS device constructed on a structurally solid area of substrate. This mechanical continuity preferably provides a more sturdy structure while still implementing the electrical isolation desired. Moreover, because the thermal properties of the silicon layers in the present invention will be similar, the thermal conductivity will preferably be high throughout the MEMS device creating favorable characteristics for thermal-oriented devices such as thermal actuators. Therefore, any heat generated within the top layer will quickly flow down throughout the thickness of the device. Thus, despite the confinement of electrical current flow to within a thin electrically conductive layer, the temperature rise created by this current flow will be substantially uniform throughout the thickness of the device, in effect as if the heat generated by the current flow were more uniformly generated throughout the thickness of the device.

Figure 6:
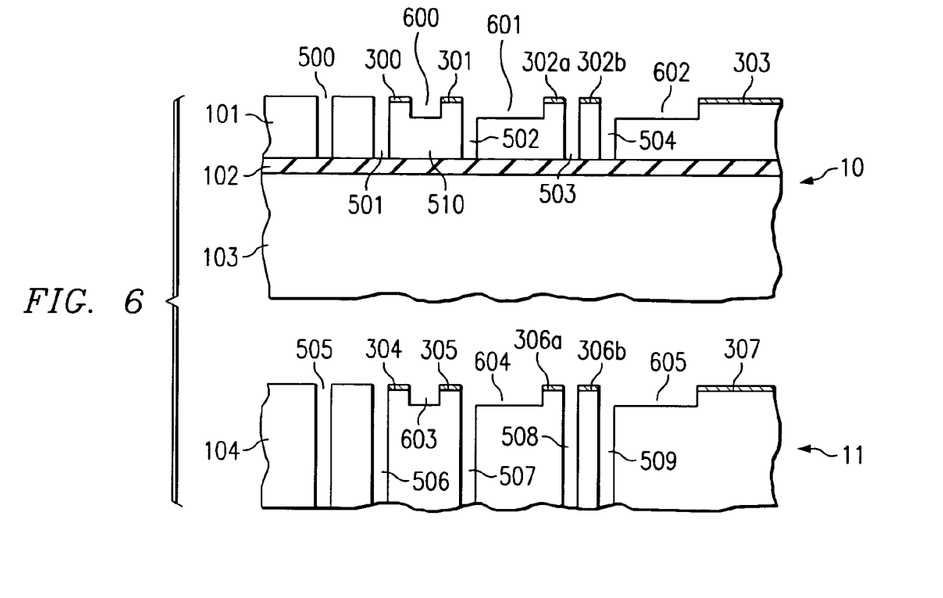
FIG. 6 is a cross-sectional diagram illustrating an additional embodiment of the present invention using shallow etching for providing additional or improved electrical isolation.

In some situations, it may be desirable to create greater or improved electrical isolation on the wafer. In such circumstances, an additional embodiment of the present invention may implement the electrical isolation using a shallow etch. FIG. 6 is a cross-sectional diagram illustrating such an additional embodiment using shallow etch isolation. A shallow etch, such as shallow gap 600 etches into SCS layer 101, however, does not completely transect SOI wafer 10 or silicon wafer 11. Shallow etching the high-resistivity silicon situated between each of conductors 300–307, such that each conductor is bounded by an air-opening, produces shallow gaps 600–605. Conductors 300–307 are now bounded by open-air, which increases the electrical isolation.

The shallow etching embodiment of the present invention may be used for increasing the electrical isolation of the conducting traces doped through the masking shown in FIGS. 2–4. Alternatively, in an additional embodiment of the present invention, instead of doping the low-resistivity region through a mask, the entire top region of SOI wafer 10 or silicon wafer 11 may be doped for low-resistivity. Thereafter, shallow etching may be employed to create the electrical isolation in the system by "carving" out the conducting traces on the top layers of the wafers.

In other similar embodiments, the low-resistivity layer may be formed through a deposition process. For example, highly-doped epitaxial silicon can be deposited ("grown") onto the SOI or silicon substrates. Since it is made of the same material as the substrate, this type of layer will possess the same advantageous mechanical properties, such as coefficient of thermal expansion and Young's modulus, as a layer formed by doping the substrate.

Figure 7A:
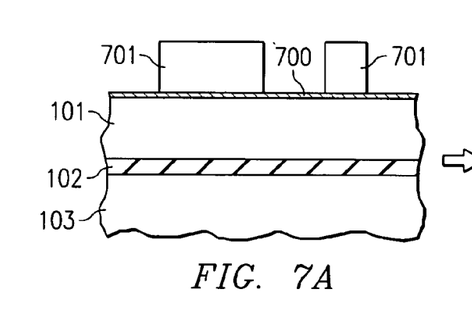
FIG. 7A is a cross-sectional view illustrating the SOI wafer having a conductive layer deposited on top and a patterned layer of photoresist.
Figure 7B:
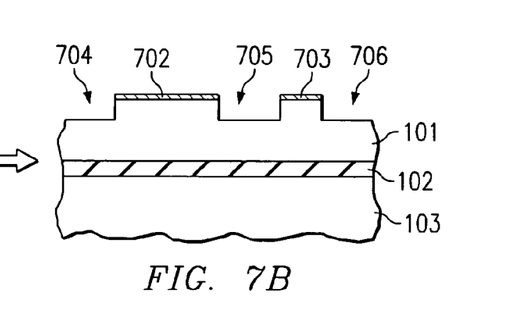
FIG. 7B is a cross-sectional view illustrating the SOI wafer wherein section of the deposited conductive layer were etched through the patterned layer of photoresist from FIG. 7A and wherein over-etching has been used to increase electrical isolation.

FIG. 7A is a cross-sectional view illustrating the SOI wafer having a conductive layer deposited on top and a patterned layer of photoresist. In FIG. 7A, continuous low-resistivity layer 700 is grown on the top surface of silicon substrate 101, and then masking layer 701 is deposited and patterned. Masking layer 701 is used to protect regions of low-resistivity layer 700 that are to remain after an etching process removes the unwanted areas. An over-etch which continues the etch into the surface of high-resistivity substrate 101 may be preferably used to further enhance the electrical isolation. FIG. 7B is a cross-sectional view illustrating the SOI wafer wherein section of deposited low-resistivity layer 700 were etched through the patterned layer of photoresist 701 from FIG. 7A to form conductors 702 and 703. Over-etching has been used to increase electrical isolation as trenches 704, 705, and 706, each increase the electrical isolation at the interfaces between low-resistiviy layer 700 and high-resistivity substrate 101.

Figure 8A:
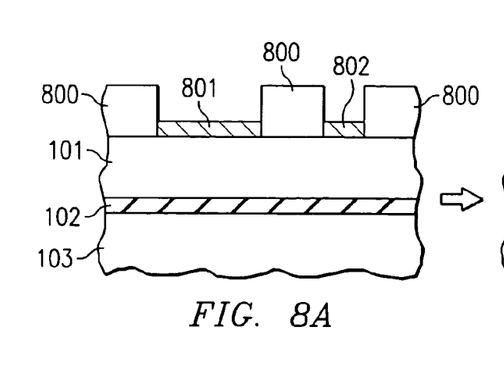
FIG. 8A is a cross-sectional view illustrating the SOI wafer having a patterned layer of silicon oxide in which a growth or deposition of epitaxial silicon is added through the silicon oxide.
Figure 8B:
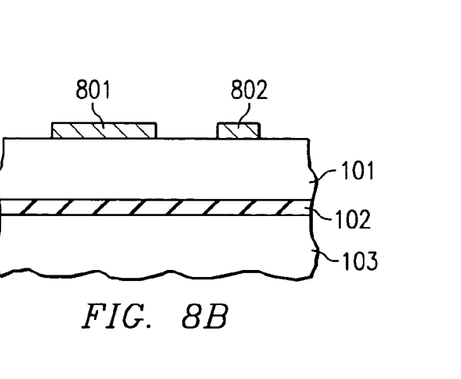
FIG. 8B is a cross-sectional view illustrating the SOI wafer having a growth or deposition of epitaxial silicon from FIG. 8A after the silicon oxide is removed.
Figure 9:
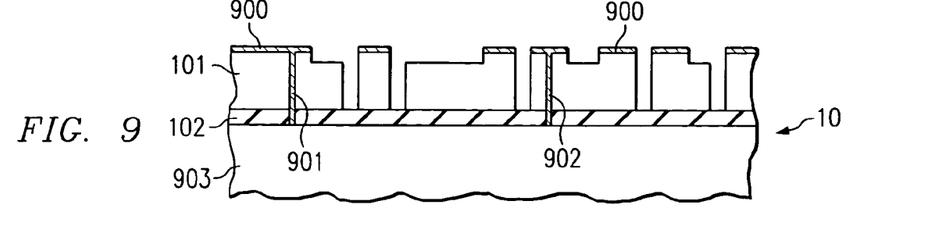
FIG. 9 is a cross-sectional diagram illustrating an additional embodiment of the present invention implemented with multiple electrical layers.

FIG. 8A is a cross-sectional view illustrating the SOI wafer having a patterned layer mask in which a growth or deposition of epitaxial silicon is added through the mask. Masking layer 800 is first deposited and patterned to leave areas of high-resistivity substrate 101 exposed where low-resistivity regions will be desired. Then, using methods for selective area epitaxy known in the art, low-resistivity silicon conductors 801 and 802 are grown in the exposed areas. It should be noted that when used with epitaxy, the mask material may include such materials as silicon dioxide. FIG. 8B is a cross-sectional view illustrating the SOI wafer having a growth or deposition of epitaxial silicon from FIG. 8A after mask material 800 is removed. Low-resistivity epitaxial conductors 801 and 802 may be oppositely doped (for example, n-type) from substrate 101 (which may for example be p-type) to form a pn junction and suitably biased to further enhance the electrical isolation, as will be described more fully later FIG. 9 is a cross-sectional diagram illustrating an additional embodiment of the present invention comprising multi-layer functionality. Some semiconductor devices are fabricated or assembled with multiple layers providing multiple functions. In such devices, it is typically desirable to implement conduction between layers. Translayer conductors 901 and 902 provide low-resistivity between conductor layer 900 and substrate layer 903, which comprises moderate to low-resistivity silicon. Thus, the two conducting layers are electrically connected at selected points.

It should be noted that SOI wafer 10, as illustrated in FIG. 9, is shown with a first region of low-resistivity silicon, conductor region 900. The electrical isolation in SOI wafer 10 may be fabricated using the shallow etching technique previously described. Therefore, conductor region 900 could be initially doped across the entire surface of SOI wafer 10 with the conducting traces subsequently etched and isolated using conventional etching techniques.

Figure 10:
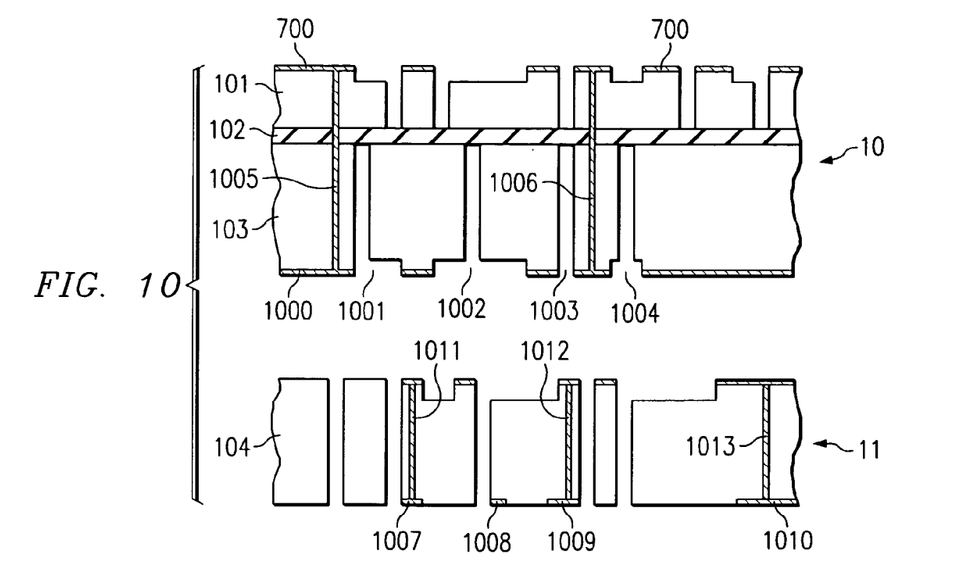
FIG. 10 is a cross-sectional diagram illustrating an additional embodiment of the present invention implemented to include a multi-layer micromechanical element.

Still additional embodiments may include micromechanical elements that are created on multiple layers. FIG. 10 is a cross-sectional diagram illustrating such an additional embodiment with a multi-layer micromechanical element. In addition to the micromechanical element shown in SOI wafer 10 of FIGS. 5–9, SOI wafer 10, depicted in FIG. 10, includes micromechanical elements created by trenches 1001–1004 in silicon substrate layer 103. The MEMS device shown in FIG. 10 includes electrical connections and conductor layers on both layers. Conducting region 900 provides the conductors for the top region, while conducting region 1000, formed by the same or similar doping techniques as discussed above, provides the conductors for the second region. BOx layer 102 may be preserved to act as an insulator between the two substrate layers 101 and 103. As can be seen in FIG. 10, electrical connections are provided between the layers through translayer conductors 1005 and 1006.

FIG. 10 also shows an additional embodiment of the present invention providing conducting layers on two sides of a single layered device. Silicon wafer 11 includes conductors 1007–1010 formed on the other side of silicon layer 104. Translayer conductors 1011–1013 facilitate electrical connection or vias between both sides of silicon layer 104. Thus, electrical signals may be communicated, not only on one side of silicon layer 104, but also on another layer as illustrated by conductors 1007–1010.

Figure 11:
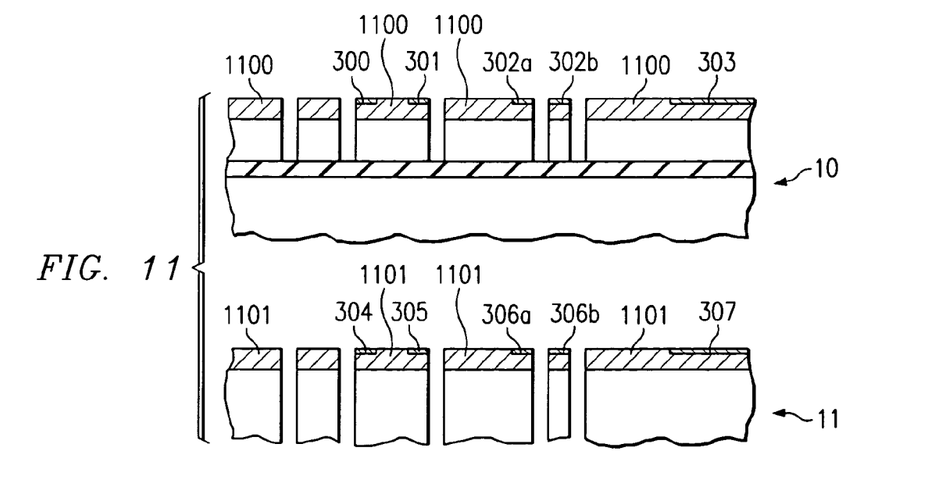
FIG. 11 is a cross-sectional view illustrating the patterned n-type doped top layers of the SOI wafer and the silicon wafer with a doped p-type layer forming pn junctions with the n-type regions.

An additional embodiment of the present invention may provide electrical isolation through the doping of pn junctions into SCS layer 101 and silicon layer 104. FIG. 11 is a cross-sectional view illustrating the patterned n-type doped top layers of SOI wafer 10 and silicon wafer 11 with a doped p-type layer forming pn junctions with the n-type regions. For purposes of this embodiment, conductors 300–303 on SOI wafer 10 and conductors 304–307 on silicon wafer 11, may be doped with an n-type dopant, such as phosphorus. SCS layer 101 and silicon layer 104 may either begin as p-type high-resistivity silicon, or an additional step may be implemented to dope the interconductor regions with a background doping level of a p-type dopant, such as boron. This additional step may alternatively comprise high-level ("p+") doping of a layer at the surface of lightly p-doped substrate 1100 and 1101. The resulting pn junctions not only provide electrical isolation when the junction is properly biased, they may also provide beneficial operative characteristics of a diode or transistor.

It should also be noted that regions of lowered conductivity may be formed by reverse doping (for example n-type) a substrate or layer that is initially relatively doped with the opposite type (for example p-type). Because of the limitations on ultimate doping concentration and the difficulty in accurately balancing the doping levels to achieve very high resistivity, other described embodiments are preferred.

Figure 12:
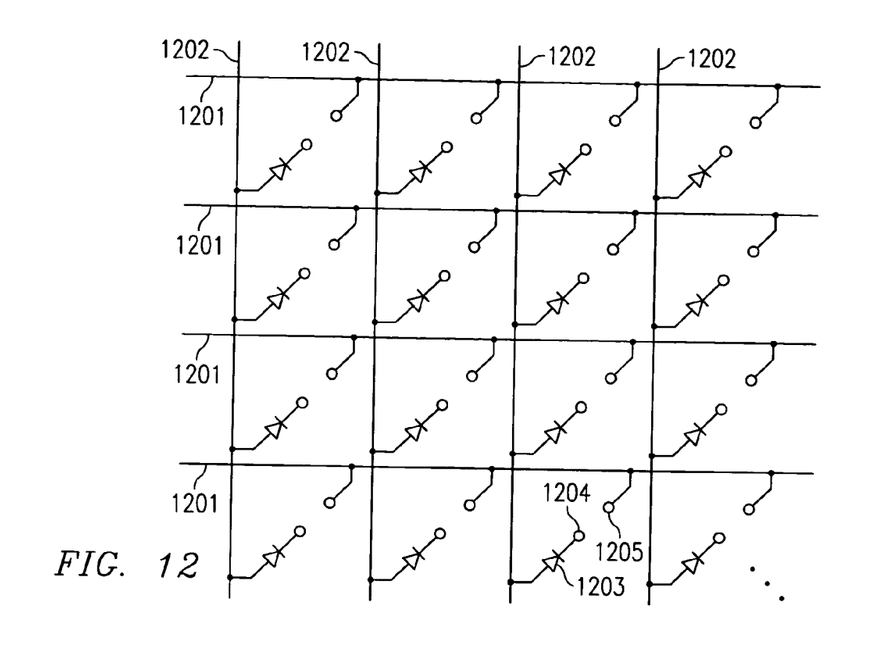
FIG. 12 is a circuit matrix for matrix addressing of a number of micromechanical devices using diodes.

Diodes or transistors integrally formed with micromechanical devices as just described may be used to enable the active matrix addressing of arrays of micromechanical devices. Such matrix addressing allows micromechanical devices to be operated using a minimum of electrical leads and contacts both on-chip and off-chip. Multiplexing techniques such as sequential scanning of the addressing leads and duty-cycle modulation can be used to minimize the required electronic drive circuitry, as well. An example of a circuit for matrix addressing of a number of micromechanical devices using diodes is shown in FIG. 12. Note that although the array of devices is depicted as a two-dimensional regular arrangement, it will be obvious to those skilled in the art that the same logical and electrical connections may be applied to a number of devices that are not arranged in an evenly-spaced or Cartesian pattern. Diodes 1203 are placed in series with connections 1204 and 1205 to the micromechanical devices at selected intersections of row address lines 1201 and column address lines 1202. These diodes serve to prevent current from flowing in unwanted paths through other devices attached to the same row or column as the selected device when selecting a particular micromechanical device at a single row-column intersection for operation. The use of diodes in the application can also improve the reliability and yield of an array of devices in the following way: since the major failure mode of a diode in this type of arrangement is a short circuit, multiple diodes can be connected in series with each device, with the multiple diodes effectively acting as a single diode, resulting only in an increase in drive voltage. That is, each diode 1203 in the drawing may be considered to be representative of a series connection of multiple diodes on either side of device connections 1204 and 1205. A failure of any one of these diodes to a short would then still leave operative diodes in series with the micromechanical device.

Figure 13:
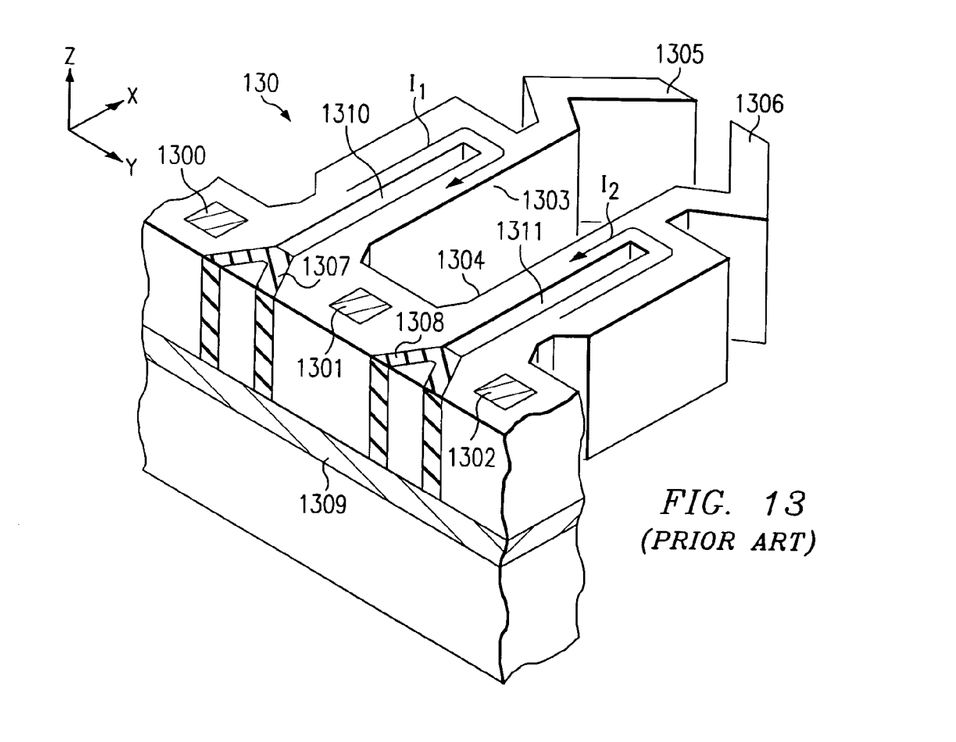
FIG. 13 is an isometric view of a micromechanical gripper fabricated using the prior art electrical isolation methods.

The benefits of the inventive system and method may be appreciated when compared to micromechanical devices fabricated using the prior art methods. FIG. 13 is a combined, dual-perspective view of a micromechanical gripper fabricated using the prior art electrical isolation methods. The lower part of FIG. 13 is a cross-sectional view of micromechanical gripper 130 fabricated into an SOI wafer. The cross-sectional view is combined with a top-view of the micromechanical gripping elements of gripper 130. Gripper 130 incorporates contact pads 1300–1302 that provide electrical contact points. For example, these contact pads can be formed by deposition and patterning of a metal film, with subsequent alloying steps to form an Ohmic contact using a process that is well known in the art. In operation, currents $I_1$ and $I_2$ are applied to pads 1300 and 1302, respectively, to flow to pad 1301. As currents $I_1$ and $I_2$ flow through microgripper arms 1303 and 1304, heat is generated causing microgripper arms 1303 and 1304 to expand, which, in turn, opens gripper tongs 1305 and 1306.

In order to facilitate current flowing through microgripper arms 1303 and 1304, contact pads 1300–1302 should preferably be electrically isolated from each other. Using the prior art methods of Clark and Adams, deep trenches are etched through the silicon layer and filled with an insulating dielectric material shown in separators 1307 and 1308. Once BOx layer 1309 releases gripper 130, the structure is fully supported by the micromechanical elements including separators 1307 and 1308. Because voids caused by the trench-fill method of creating separators 1307 and 1308 may result in mechanical weaknesses, the overall mechanical soundness of gripper 130 may be questionable. Moreover, the dielectric material may have a different thermal expansion coefficient than the underlying silicon substrate, thereby increasing the possibility of failure caused by the different expansion rates under heat.

Moreover, in the prior art methods of Clark and Adams, because a weakness exists in the mechanical connections between contact pads 1300–1302, there is a chance that the pads may be skewed out-of-plane. If pads 1300–1302 become out-of-plane, gripper arms 1303 and 1304 may also become out-of-plane, which would cause gripper tongs 1305 and 1306 to become out-of-plane resulting in an out-of-plane motion that could render the tongs incapable of accurately gripping a targeted sub-millimeter electromechanical component.

Figure 14:
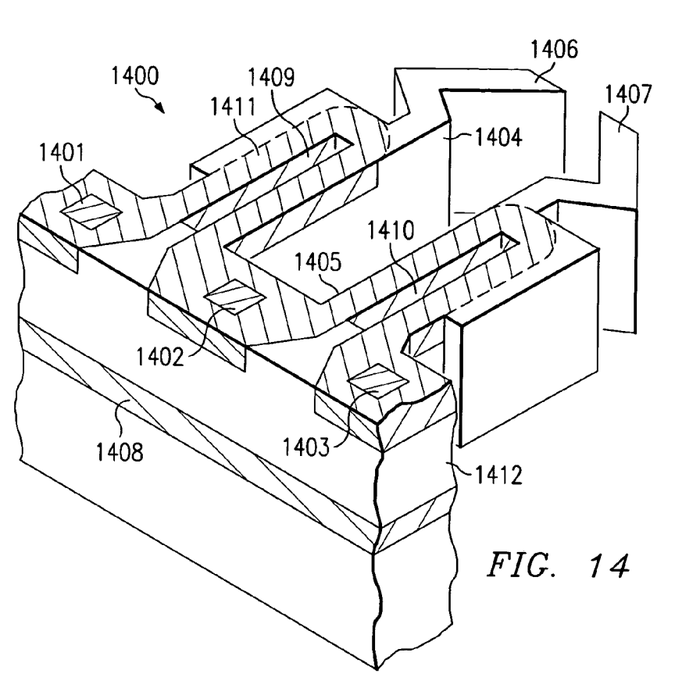
FIG. 14 is an isometric view of a micromechanical gripper fabricated using methods described in one embodiment of the present invention.

FIG. 14 is an isometric view of a micromechanical gripper fabricated using one embodiment of the present invention. Gripper 1400 comprises similar component parts, such as contact pads 1401–1403, arms 1404 and 1405, and tongs 1406 and 1407. However, the construction of gripper 1400 is substantially different. As discussed above, a top region of conductive material is doped into an underlying region of high-resistivity silicon. Conductive doping 1411 may preferably be implanted through a mask region in order to obtain the appropriate conductive traces. Therefore, according to gripper 1400 illustrated in FIG. 10, current applied at contact pads 1401 and 1403 will preferably flow through conductive doping 1411 to contact pad 1402 through arms 1404 and 1405. However, because SCS layer 1412 comprises high-resistivity silicon, pads 1401–1403 are electrically isolated from one another without creating potential failure points through deep trenching. In fact, the embodiment illustrated in FIG. 14, showing the base structure of gripper 1400 comprising SCS layer 1412 and contact pads 1401–1403, is preferably a solid piece and would preferably remain solid after gripper 1400 is released by etching away BOx layer 1408. The resulting MEMS device is structurally more sound and exhibits similar thermal conduction characteristics from the top layers to the bottom layers, which are constructed of the same material. Moreover, because the base structure is a solid piece and, thus, more mechanically rigid, the elements of gripper 1400 will remain in plane.

Figure 15:
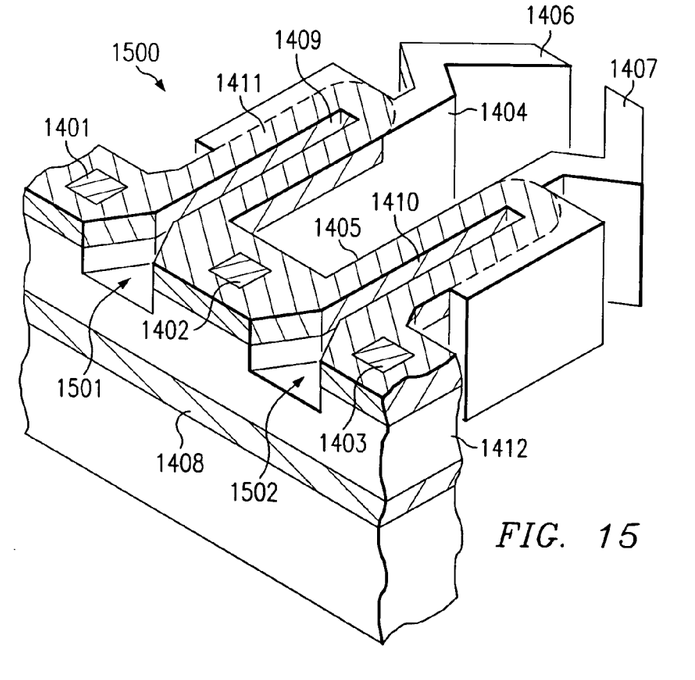
FIG. 15 is a combined, dual-perspective view of a micromechanical gripper fabricated using methods described in an additional embodiment of the present invention.

FIG. 15 is an isometric view of a micromechanical gripper fabricated using an additional embodiment of the present invention. Instead of forming the electrical isolation solely through the seam of the high-resistivity silicon of SCS layer 1412 and conductive doping 1411, as shown in FIG. 14, gripper 1500 provides electrical isolation by etching shallow trenches 1501 and 1502 between contact pads 1401–1403. Because the base structure of gripper 1500 remains a solid piece except for shallow trenches 1501 and 1502, electrical isolation is again achieved without sacrificing either mechanical soundness or thermal conductivity.

Figure 16:
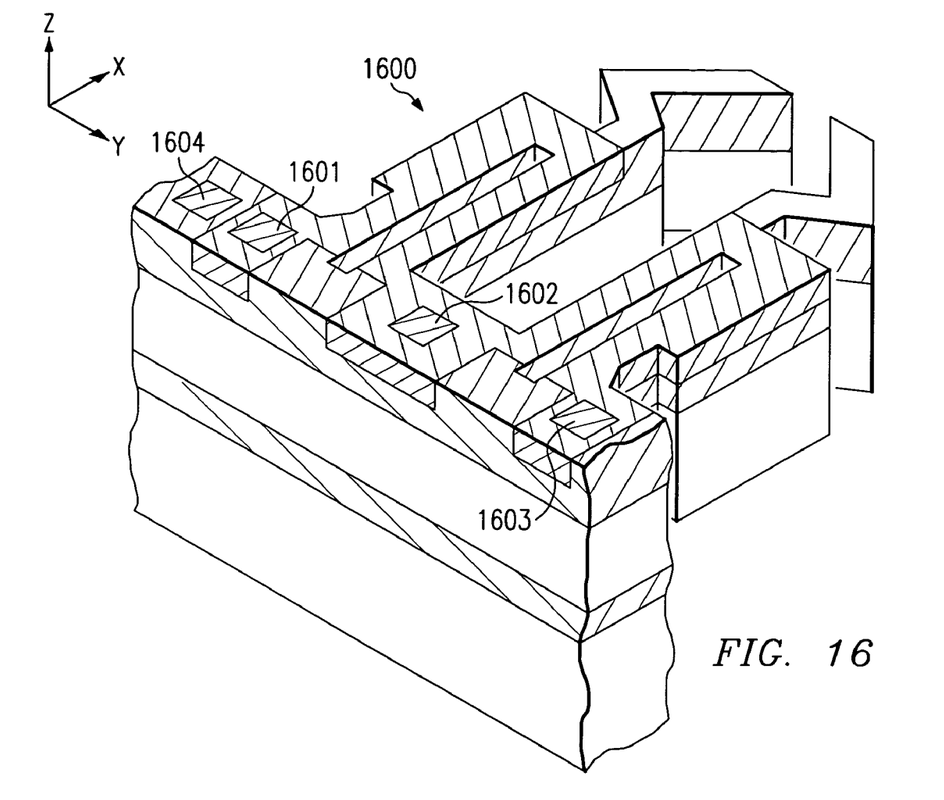
FIG. 16 is a combined, dual-perspective view of a micromechanical gripper fabricated using methods described in an embodiment of the present invention wherein the interfaces between the high and low resistivity regions form pn junctions.

FIG. 16 is an isometric view of a micromechanical gripper fabricated using an additional embodiment of the present invention. In this example, the electrical isolation is formed using the pn junction isolation technique described in FIG. 11. It can be seen that in addition to contact pads 1601–1603, another contact pad 1604 is preferably provided to the substrate or background-doped layer to enable application of a reverse bias voltage to enhance the isolation.

Figure 17:
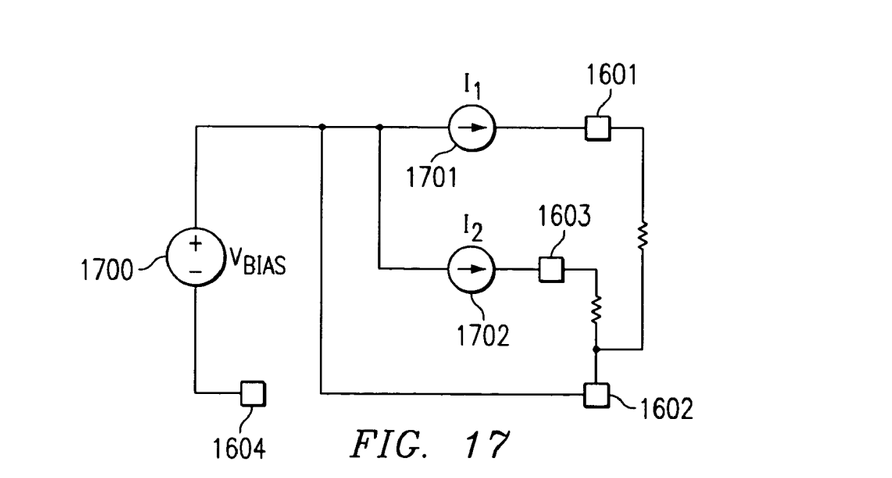
FIG. 17 is a circuit schematic illustrating an exemplary biasing scheme for the pn junctions shown in FIG. 16 to electrically isolate the interfaces.

FIG. 17 shows a biasing circuit to be used with the micromechanical gripper of FIG. 16. Bias voltage supply 1700 is used to apply a reverse bias voltage between substrate or p-layer contact pad 1604 and n-layer contact pad 1602 on the gripper for enhanced isolation. Current sources 1701 and 1702 are connected to contact pads 1601 and 1603, respectively to enable current actuation of the two-gripper tongs independently. Alternatively, a single current source could be substituted, with the current split passively between pads 1601 and 1603. Contact pad 1602, which is connected to the n-layer common to both gripper tongs, serves as a common drive current return path.

Figure 18A:
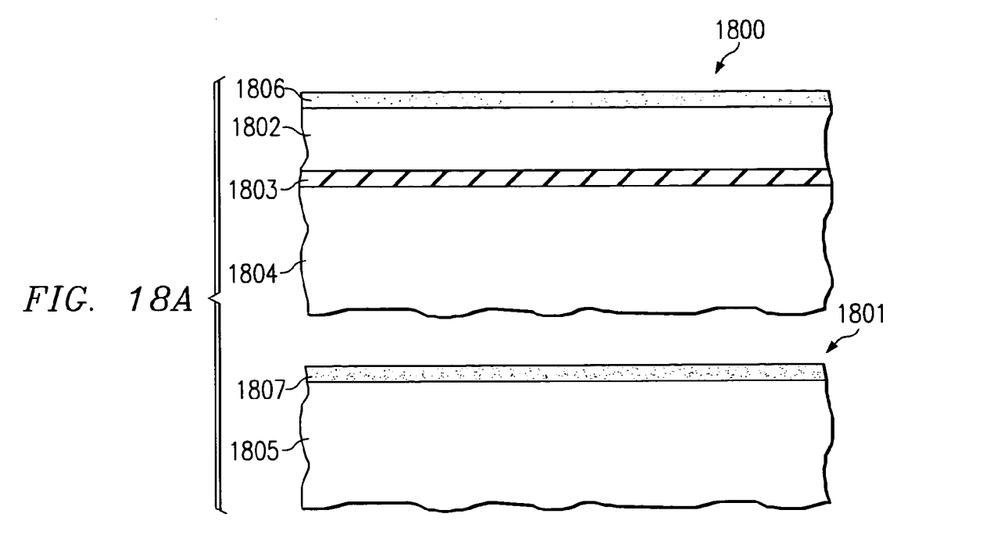
FIG. 18A is a cross-sectional diagram of a SOI wafer and a silicon wafer that comprises a low-resistivity substrate and a layer of insulator deposited on the low-resistivity substrate.

Additional embodiments of the present invention may provide electrical isolation using SOI and silicon wafers comprising low-resistivity silicon. FIG. 18A is a cross-sectional diagram of SOI wafer 1800 and silicon wafer 1801 that comprises low-resistivity layers 1802 and 1805. SOI wafer 1800 additionally includes BOx layer 1803 and silicon substrate layer 1804. Insulating layers 1806 and 1807 are preferably deposited on low-resistivity layers 1802 and 1805. Insulating layers 1806 and 1807 may comprise materials, such as nitride or other similar insulating material.

Figure 18B:
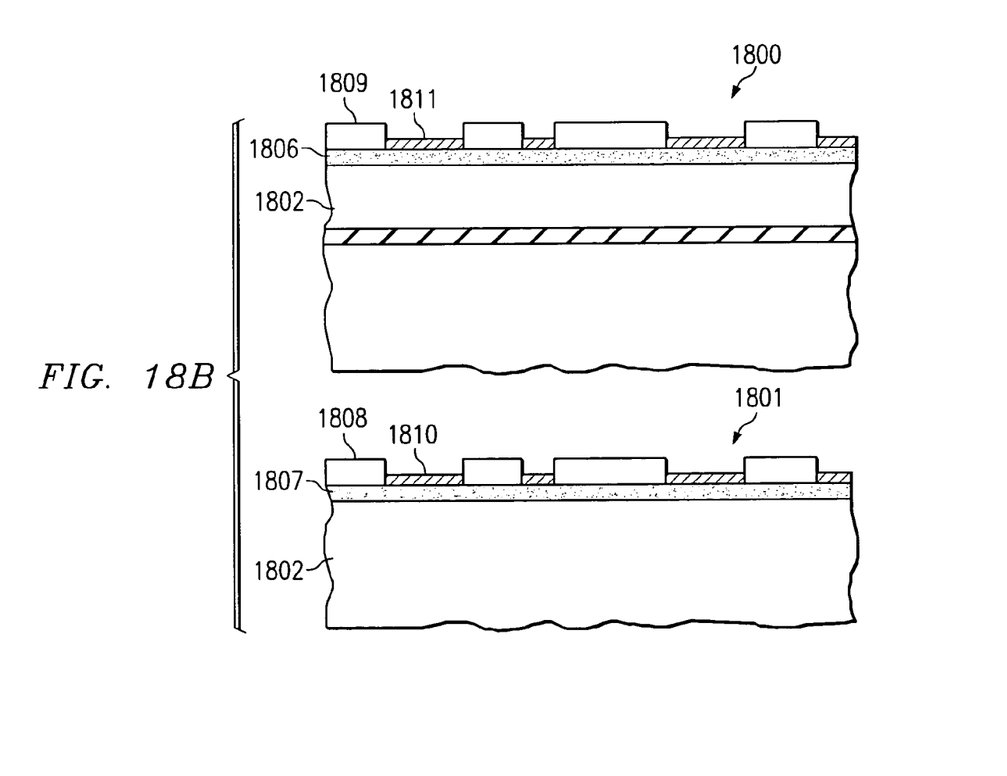
FIG. 18B is a cross-sectional diagram of the SOI wafer and the silicon wafer of FIG. 18A including a mask layer and a layer of conducting material deposited on said wafers.
Figure 18C:
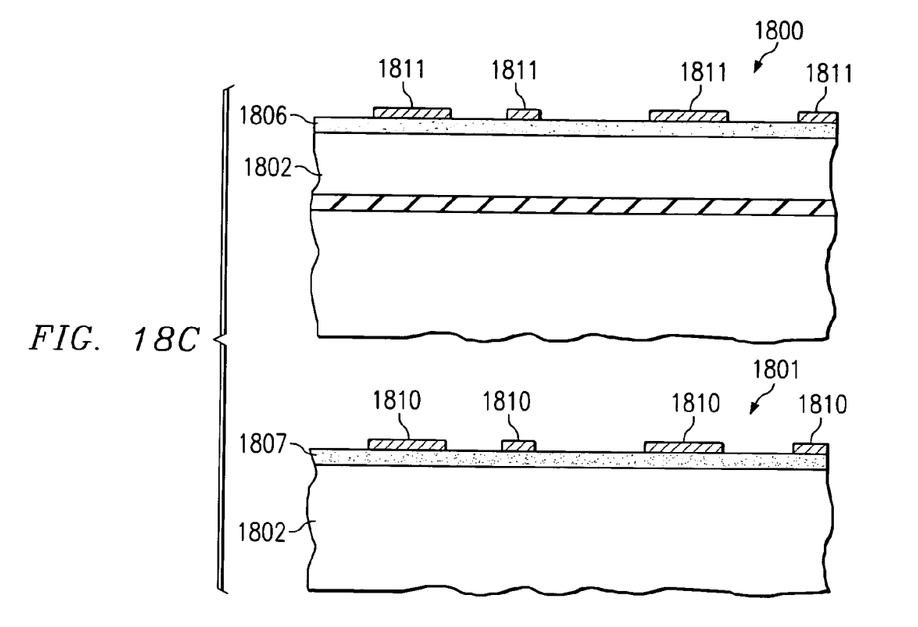
FIG. 18C is a cross-sectional diagram of the SOI wafer and the silicon wafer of FIG. 18B with the mask layer removed.

FIG. 18B is a cross-sectional diagram of SOI wafer 1800 and silicon wafer 1801 of FIG. 18A including mask layers 1808 and 1809. Within the open regions in mask layers 1808 and 1809, conducting layers 1810 and 1811 preferably are deposited or grown on insulating layers 1806 and 1807. FIG. 18C is a cross-sectional diagram of SOI wafer 1800 and silicon wafer 1801 of FIG. 18B with mask layers 1808 and 1809 removed. By depositing insulating layers 1806 and 1807 conducting layers 1810 and 1811 are isolated and removed electrically from low-resistivity layers 1802 and 1805. Therefore, when current is run through conducting layers 1810 and 1811, it is preferably isolated from other low-resistivity layers 1802 and 1805.

Figure 19:
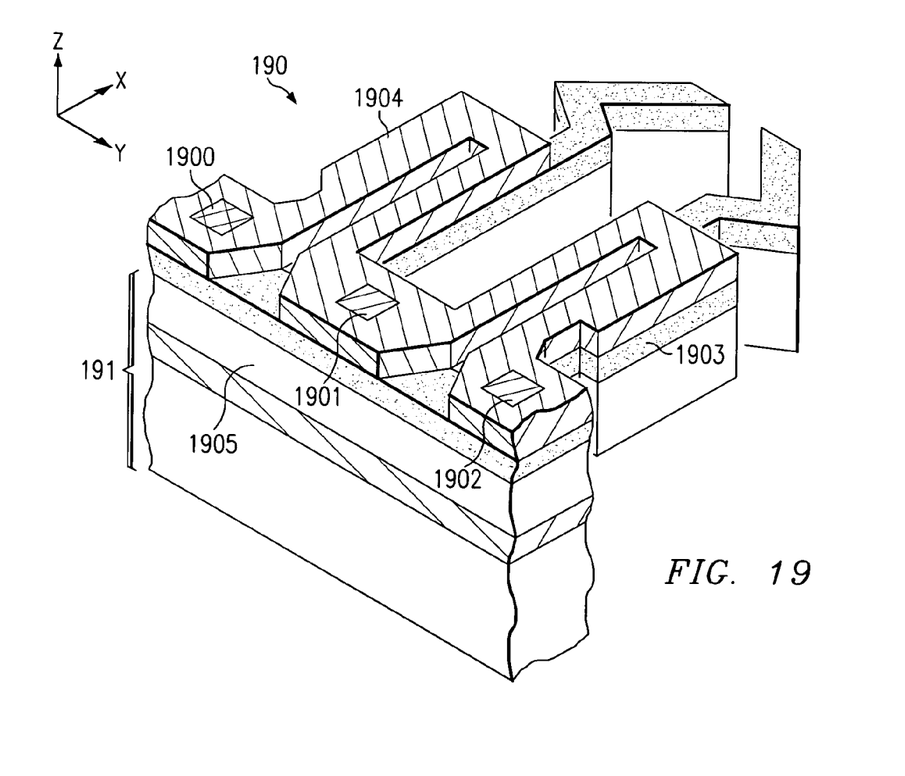
FIG. 19 is a combined, dual-perspective view of a micromechanical gripper fabricated using methods as described in the embodiment of FIGS. 18A–C.

FIG. 19 is a combined, dual-perspective view of micromechanical gripper 190 fabricated using methods as described in the embodiment of FIGS. 18A–C. micromechanical gripper 190 is based on SOI wafer 191. Silicon substrate 1905 comprises a low-resistivity silicon. Insulating layer 1903 is preferably deposited on silicon substrate 1905. Conducting layer 1904 is then deposited on top of insulating layer 1903. Insulating layer 1903 isolates conducting layer 1904 from the conducting properties of silicon substrate 1905. Contact pads 1900–1902 provide the connection points for the external stimulus that controls micromechanical gripper 190. Therefore, as current is introduced to conducting layer 1904 at contact pads 1900–1902, the current is electrically isolated not only from the conducting properties of silicon substrate 1905, but also from other portions of the device.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the patricular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for fabricating a monolithic sub-millimeter-scaled electromechanical device having electrical isolation properties, said method comprising the steps of:
   doping one or more low-resistivity regions into one or more high-resistivity substrates;
   patterning said one or more low-resistivity regions;
   etching at least one sub-millimeter mechanical device from said one or more high-resistivity substrates;
   providing electrical connection between at least two of said patterned one or more low-resistivity regions; and
   etching at least one shallow trench into said one or more high-resistivity substrates to increase said electrical isolation properties;
   wherein said one or more high-resistivity substrates comprises a silicon on insulator (SOI) wafer.

2. The method of claim 1 wherein said doping step includes the step of:
   diffusing a low-resistivity dopant into said one or more high-resistivity substrates.

3. The method of claim 1 wherein said doping step includes the step of:
   ion implanting a low-resistivity dopant into said one or more high-resistivity substrates.

4. The method of claim 1 wherein said patterning step includes the step of:
   masking said one or more high-resistivity substrates with a pattern prior to said doping step.

5. The method of claim 1 wherein said patterning step includes the step of:
   etching at least one shallow trench through said one or more low-resistivity regions in a desired pattern.

6. The method of claim 1 wherein said at least one shallow trench is adjacent to a patterned conducting region.

7. The method of claim 1 further comprising the step of:
   bonding said high-resistivity substrates.

8. The method of claim 1 further comprising the step of:
   providing an insulating layer at a seam between regions of said at least one or more high-resistivity substrates.

9. The method of claim 1 wherein said patterning step includes the step of:
   providing in-plane electrical connections at pre-defined locations within said one or more low-resistivity regions.

10. The method of claim 1 wherein the step of providing electrical connection includes the steps of:
    etching a via between said at least two of said patterned one or more low-resistivity regions; and
    depositing a conductor in said etched via.

11. The method of claim 1 wherein a seam between said one or more low-resistivity regions and one or more high-resistivity substrates forms at least one pn junction.

12. The method of claim 11 wherein said one or more low-resistivity regions is p-type.

13. The method of claim 11 wherein said one or more low-resistivity regions is n-type.

14. The method of claim 11 further comprising the step of:
    reverse biasing said at least one pn junction.

15. A microelectromechanical (MEM) device comprising:
    a highly resistive device region;
    a first conductive region doped into said highly resistive device region, wherein said conductive region is patterned on said highly resistive device region; and
    a micromechanical element etched from said highly resistive device region;
    wherein a seam between said first conductive region and said highly resistive device region forms one or more pn junctions.

16. The MEM device of claim 15 wherein said conductive region pattern is generated from a set of at least one shallow etches selectively removing portions of said conductive region.

17. The MEM device of claim 15:
    wherein said highly resistive device region has a resistivity within a range of 1 k Ohm-centimeters and 10 k Ohm-centimeters; and
    wherein said first conductive region has a resistivity within a range of 0.01 Ohm-centimeters and 0.001 Ohm-centimeters.

18. The MEM device of claim 15 wherein said highly resistive device region comprises a single crystal silicon (SCS) layer on a silicon on insulator (SOI) wafer.

19. The MEM device of claim 15 wherein said one or more pn junctions is reverse biased.

20. The MEM device of claim 15 wherein said conductive region pattern is generated from doping through a mask.

21. The MEM device of claim 20 wherein said electrical isolation between regions of said conductive region is increased by a set of at least one shallow etches selectively removing portions of said conductive region.

22. The MEM device of claim 21 wherein said electrical isolation is further increased by removing shallow layers of said highly resistive device region.

23. The MEM device of claim 22 wherein said removed portions of said highly resistive device region are adjacent to said conductive region pattern.

24. The MEM device of claim 15 further comprising:
a second conductive region doped into said highly resistive device region, wherein said second conductive region is patterned on said highly resistive device region.

25. The MEM device of claim 24 wherein said second conductive region pattern is generated from doping through a mask.

26. The MEM device of claim 25 wherein electrical isolation between regions of said second conductive region is increased by a set of at least one shallow etches selectively removing portions of said second conductive region.

27. The MEM device of claim 26 wherein said electrical isolation is further increased by removing shallow layers of said highly resistive device region.

28. The MEM device of claim 24 wherein said second conductive region pattern is generated from a set of at least one shallow etches selectively removing portions of said second conductive region.

29. The MEM device of claim 24 further comprising at least one translayer conductor electrically connecting said first conductive region and said second conductive region.

30. The MEM device of claim 29 wherein said at least one translayer conductor is disposed within said highly conductive device region.

31. The MEM device of claim 15 further comprising:
one or more additional highly resistive device layers; and
one or more additional micromechanical elements etched from said one or more additional highly resistive device layers.

32. The MEM device of claim 31 wherein said micromechanical element and said one or more additional micromechanical elements are mechanically connected.

33. The MEM device of claim 31 further comprising:
one or more additional conductive layers doped into said one or more additional highly resistive device layers, wherein said one or more additional conductive layers is patterned on said one or more additional highly resistive device layers.

34. The MEM device of claim 31 wherein said one or more additional conductive layers pattern is generated from doping through at least one mask.

35. The MEM device of claim 34 wherein electrical isolation between said one or more additional conductive layers is increased by a set of at least one shallow etches selectively removing portions of said one or more additional conductive device layers.

36. The MEM device of claim 31 wherein said one or more additional conductive layers pattern is generated from a set of at least one shallow etches selectively removing portions of said one or more additional conductive layers.

37. The MEM device of claim 33 further comprising at least one translayer conductor electrically connecting at least two of said first conductive region and said one or more additional conductive layers.

38. The MEM device of claim 31 wherein said highly resistive device region and said one or more additional highly resistive device layers have resistivities within a range of 1 thousand Ohm-centimeters and 10 thousand Ohm-centimeters.

39. The MEM device of claim 33 wherein said first conductive region and said one or more additional conductive layers have resistivities within a range of 0.01 Ohm-centimeters and 0.001 Ohm-centimeters.

40. The MEM device of claim 31 wherein at least one of said highly resistive device region and said one or more additional highly resistive device layers comprise an SCS layer on an SOI wafer.

41. A method for fabricating a physically robust microelectromechanical (MEM) device having isolated electrical conductors, said method comprising the steps of:
forming a patterned conducting region within a substrate, said substrate having a high resistivity; and
etching a micromechanical element into said substrate;
wherein a seam between said patterned conducting region and said substrate forms at least one pn junction.

42. The method of claim 41 wherein said patterned conducting region has a conductivity within a range of 0.01 (Ohm-centimeters) and 0.001 (Ohm-centimeters).

43. The method of claim 41 wherein said substrate has a resistivity within a range of 103 Ohm-centimeters and 106 Ohm-centimeters.

44. The method of claim 41 wherein said substrate comprises a silicon on insulator (SOI) substrate.

45. The method of claim 41 wherein said forming step includes the step of:
inserting a conductive dopant into a shallow region of said substrate.

46. The method of claim 41 wherein said forming step includes the step of:
growing a conductive layer on said substrate.

47. The method of claim 46 further comprising:
growing an insulating layer on said substrate prior to said growing said conductive layer step.

48. The method of claim 47 further comprising:
patterning said insulating layer prior to said growing said conductive layer step.

49. The method of claim 45 wherein said inserting step includes one of:
diffusing said conductive dopant into said substrate; and
ion implanting said conductive dopant into said substrate.

50. The method of claim 45 wherein said forming step further includes the step of:
patterning a mask onto said substrate prior to said inserting step, said mask causing said conductive dopant to be inserted into said substrate in a predetermined pattern.

51. The method of claim 45 wherein said forming step further includes the steps of:
patterning a mask onto said shallow region according to a predetermined design for said patterned conducting region; and
etching away portions of said shallow region not covered by said mask.

52. The method of claim 50 further comprising the step of:
etching at least one shallow trench in said substrate, wherein said at least one shallow trench is adjacent to said patterned conducting region.

53. The method of claim 41 further comprising the step of:
forming at least one additional patterned conducting region on said substrate.

54. The method of claim 53 further comprising the step of:
electrically connecting two or more of said patterned conducting region and said at least one additional patterned conducting region.

55. The method of claim 41 further comprising the steps of:
adding one or more additional substrate layers to said MEM device, said one or more additional substrate layers having at least one additional micromechanical element.

56. The method of claim 55 wherein two or more of said micromechanical element and said at least one additional micromechanical element are physically connected.

57. The method of claim 55 further comprising the step of:
forming one or more additional patterned conducting layers in said one or more substrate layers.

58. The method of claim 57 further comprising the step of:
electrically connecting at least two of said patterned conducting region and said one or more additional patterned conducting regions.

59. A sub-millimeter electromechanical component having electrically isolated conductors and a rugged physical structure, said component comprising:
a sub-millimeter mechanical element etched from a substrate of high-resistivity semiconductor material; and
one or more conductors doped into at least one shallow region of said substrate, wherein interfaces between said high-resistivity semiconductor material and a low-resistivity semiconductor material forming said one or more conductors electrically isolates said one or more conductors;
wherein said high-resistivity semiconductor material is a first one of a p-type semiconductor material and an n-type semiconductor material, and said low-resistivity semiconductor material is a second one of the p-type semiconductor material and the n-type semiconductor material.

60. The component of claim 59 wherein said one or more conductors are doped through a predefined photomask on said substrate.

61. The component of claim 60 wherein one or more shallow trenches are formed by etching into said layer of high-resistivity semiconductor material at said interfaces.

62. The component of claim 59 wherein said low-resistivity semiconductor material is doped into said at least one shallow region of said substrate and said one or more conductors is formed by etching selected portions of said low-resistivity semiconductor material from said at least one shallow region in a predefined pattern.

63. The component of claim 59 wherein said pn junction is reverse-biased to enhance said electrical isolation between said high-resistivity semiconductor material and said low-resistivity material.

64. The component of claim 59 wherein said pn junction forms an active device.

65. The component of claim 59 further comprising:
translayer conductors electrically connecting two or more of said one or more conductors.

66. The component of claim 59 further comprising:
one or more additional layers of high-resistivity semiconductor material;
at least one sub-millimeter mechanical element etched from said one or more additional layers; and
one or more electrically isolated conductors doped into at least one shallow region of said one or more additional layers.

67. The component of claim 66 further comprising:
one or more translayer conductors electrically connecting two or more of said one or more conductors and said one or more electrically isolated conductors.

68. The component of claim 59 wherein said substrate comprises a single crystal silicon (SCS) layer of a silicon on insulator (SOI) wafer.

69. The component of claim 66 wherein at least one of said substrate and said one or more additional layers comprises an SCS layer of an SOI wafer.

* * * * *